(12) United States Patent
Onomura et al.

(10) Patent No.: US 6,185,238 B1
(45) Date of Patent: Feb. 6, 2001

(54) NITRIDE COMPOUND SEMICONDUCTOR LASER AND ITS MANUFACTURING METHOD

(75) Inventors: Masaaki Onomura, Kawasaki; Genichi Hatakoshi, Yokohama; Shinya Nunoue, Ichikawa; Masayuki Ishikawa, Yokohama, all of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/026,913

(22) Filed: Feb. 20, 1998

(30) Foreign Application Priority Data

Feb. 21, 1997 (JP) .................................................... 9-037289

(51) Int. Cl.[7] ....................................................... H01S 3/19
(52) U.S. Cl. ................. 372/46; 372/43; 372/45; 372/50
(58) Field of Search .................. 372/43, 45, 46, 372/50

(56) References Cited

U.S. PATENT DOCUMENTS

| 4,817,103 | * | 3/1989 | Holonyak, Jr. et al. | 372/45 |
| 4,916,710 | * | 4/1990 | Hattori | 372/50 |
| 5,903,017 | * | 5/1999 | Itaya et al. | 257/190 |

FOREIGN PATENT DOCUMENTS

| 8-255932 | 10/1996 | (JP) . |
| 9-199787 | 7/1997 | (JP) . |

* cited by examiner

*Primary Examiner*—Hemang Sanghavi
*Assistant Examiner*—Benjamin Cushwu
(74) *Attorney, Agent, or Firm*—Oblon, Spivak, McClelland, Maier & Neustadt, P.C.

(57) ABSTRACT

In a nitride compound semiconductor laser including an active layer sandwiched by semiconductor layers of different conduction types on a sapphire substrate, layers of polyimide for current blocking and light confinement are formed on side surfaces of a mesa-type current confining structure with and under the p-side electrode. The laser ensures efficient, uniform carrier injection into the active layer, suppresses higher-order modes other than the fundamental transverse mode, and thereby promises a high reliability ensuring continuous pulsation under a low threshold current and a low operation voltage with low noise characteristics.

23 Claims, 5 Drawing Sheets

NITRIDE COMPOUND SEMICONDUCTOR LASER AND ITS MANUFACTURING METHOD

BACKGROUND OF THE INVENTION

1. Field of the Invention

This invention relates to a semiconductor device using nitride compound semiconductors and, in particular, to a gallium nitride blue-violet semiconductor laser and its manufacturing method.

2. Description of the Related Art

Galium nitride compound semiconductors, such as GaN, InGaN, GaAlN and InGaAlN, are recently remarked as materials of short-wavelength semiconductor lasers for use in high-density optical disc systems because the laser light with a short wavelength can be tightly focused and is therefore effective for increasing the recording density.

In general, in order to ensure the emission of semiconductor lasers with a low threshold current, carrier injection to the active layer must be performed effectively. For this purpose, it is important to form a hetero-structured p-n junction and a current confining structure. Additionally, semiconductor lasers for use as a light source of a pickup-head in an optical disc system must be regulated in oscilation mode. Therefore, a structure is required to obtain a stable emission in the fundamental oscilation mode by increasing the differences in refractive index between the active layer and the neighboring layers, and by appropriately absorbing laser light swerving from the active layer to decrease gains of higher-order modes.

However, in the case of nitride compound semiconductor lasers, there has been no report except for so-called gain-guiding lasers in which a ridge structure is employed only for a stripe-shaped electrode or a p-type semiconductor layer. On the other hand, it is known from semiconductor lasers using InGaAlP or other conventional materials that an active layer of a multi-quantum well structure is better than a bulk active layer to decrease the threshold current density. As for nitride compound semiconductor lasers, however, although multi-quantum well structures have been originally used as the active layer, power consumption is still large because they need a high threshold current and a high operation voltage. It results in too short laser lives and too large noise of oscillated laser light to use the lasers in optical disc systems. Moreover, since the maximum optical output of conventional gain-guided semiconductor lasers is on the order of mW, they are insufficient for use as a high-power light source available for 30 mW required for deletion and recording in optical disc systems.

This is caused by the difficulty in carrier injection into the quantum well active layer with a high density and a high efficiency, the difficulty in making a structure controllable in the fundamental transverse mode for low noise characteristics, and the difficulty in integrating a plurality of semiconductor lasers. That is, it has been difficult to inject carriers into the active layer with a high current density necessary for the fundamental transverse mode by confining and guiding the current from the electrode into the active layer without deviation from the active layer while making an appropriate absorption region for obtaining only the fundamental transverse mode. Moreover, integration of a plurality of nitride compound semiconductor lasers has been difficult due to the difficulty in alternately forming current confining regions and absorption regions.

As discussed above, for actual application of lasers to optical disc systems, or the like, it is necessary to realize a highly reliable gallium nitride blue-violet semiconductor laser promising continuous emission in the fundamental transverse mode with a low threshold current and low voltage.

Conventional semiconductor lasers using nitride compound semiconductors are not good in noise characteristics because of the difficulty in making a current confining structure controllable in the fundamental transverse mode. Additionally, because of the difficulty of high-density carrier injection into the active layer, it has been difficult to realize a device for a high optical output with a low threshold current and a low operation voltage.

SUMMARY OF THE INVENTION

It is therefore an object of the invention to provide a nitride compound semiconductor laser operative with a low threshold current and a low voltage and having low noise characteristics and a high reliability, which makes it easy to form a structure controllable in the fundamental transverse mode and includes a current confining structure ensuring high-density carrier injection into the active layer.

According to the invention, there is provided a nitride compound semiconductor laser comprising:

a multi-layered structure made of gallium nitride compound semiconductors ($Ga_xIn_yAl_zN$ where $x+y+z=1$, $0 \leq x \leq 1$, $0 \leq y \leq 1$ and $0 \leq z \leq 1$), including, at least, a first cladding layer of a first conduction type, an active layer overlying the first cladding layer, and a second cladding layer of a second conduction type overlying the active layer; and current blocking layers made by forming at least two grooves extending from the major surface of the multi-layered structure closer to the second cladding layer and by filling the grooves with an insulator.

According to another aspect of the invention, there is provided a nitride compound semiconductor laser comprising:

a multi-layered structure made of gallium nitride compound semiconductors ($Ga_xIn_yAl_zN=1$, where $0 \leq x \leq 1$, $0 \leq y \leq 1$ and $0 \leq z \leq 1$), including, at least, a first cladding layer of a first conduction type, an active layer overlying the first cladding layer, and a second cladding layer of a second conduction type overlying the active layer; and current blocking layers made by forming at least two grooves extending from the major surface of said multi-layered structure closer to the second cladding layer and by filling the grooves with a gallium nitride compound semiconductor of the first conduction type.

In preferable versions of the invention, (1) the current blocking layers may be deep enough to reach the first cladding layer, the second cladding layer or a contact layer;

(2) the insulator forming the current blocking layers may be an organic insulator such as polyimide, oxide or nitride;

(3) the active layer may have a multi-quantum well structure;

(4) the relation of $W1 \leq 4 \cdot W2$ is established where the W1 is the distance between every adjacent two current blocking layers and W2 is the thickness of one of semiconductor layers in the multi-layered structure, having the first conduction type and being in contact with electrode metal;

(5) the nitride compound semiconductor laser may include at least three current blocking layers;

(6) these three or more current blocking layers are unequally distant; and/or (7) the distance between every two adjacent current blocking layers may be 10 μm or less.

According to another aspect of the invention, there is provided a method for manufacturing a nitride compound semiconductor laser comprising the steps of:

forming a multi-layered structure of nitride compound semiconductors including, at least, a first cladding layer of a first conduction type, an active layer and a second cladding layer of a second conduction type;

selectively forming a stripe-shaped electrode for a semiconductor layer of the second conduction type on the multi-layered structure;

applying an etching mask on the multi-layered structure, the etching mask having apertures at opposite sides of the stripe-shaped electrode;

etching the multi-layered structure by using the etching mask and the electrode as a mask to form grooves in self-alignment at opposite sides of the stripe-shaped electrode; and filling the grooves to form current blocking layers.

In preferable versions of the invention, (1) the method may further include the step of covering the electrode with a mask before forming the grooves;

(2) the step of forming the current blocking layers may include the step of filling the grooves with polyimide.

According to the invention, since the nitride compound semiconductor laser has the mesa-type current injection layer above the active layer and the current blocking layers on side surfaces of the mesa-type current injection layer, it is possible to form not only the current confining structure but also the fundamental transverse mode control structure. Therefore, a nitride compound semiconductor laser is realized which ensures efficient carrier injection into the active layer, suppresses higher-modes, and promises reliable continuous oscillation under a low threshold current and a low operation voltage with low noise characteristics, and it satisfies performances required for a laser used as a light source in an optical disc system, for example.

Moreover, according to the invention, the current confining structure can be made easily with a high accuracy in a self-alignment process. Additionally, since a plurality of current confining structures can be readily formed in an array simultaneously, a high-power laser desired for use in erasure and recording in an optical disc system.

DETAILED DESCRIPTION OF THE PREFERRED EMBODIMENTS

Explained below are embodiments of the invention with reference to the drawings.

Figure 1:
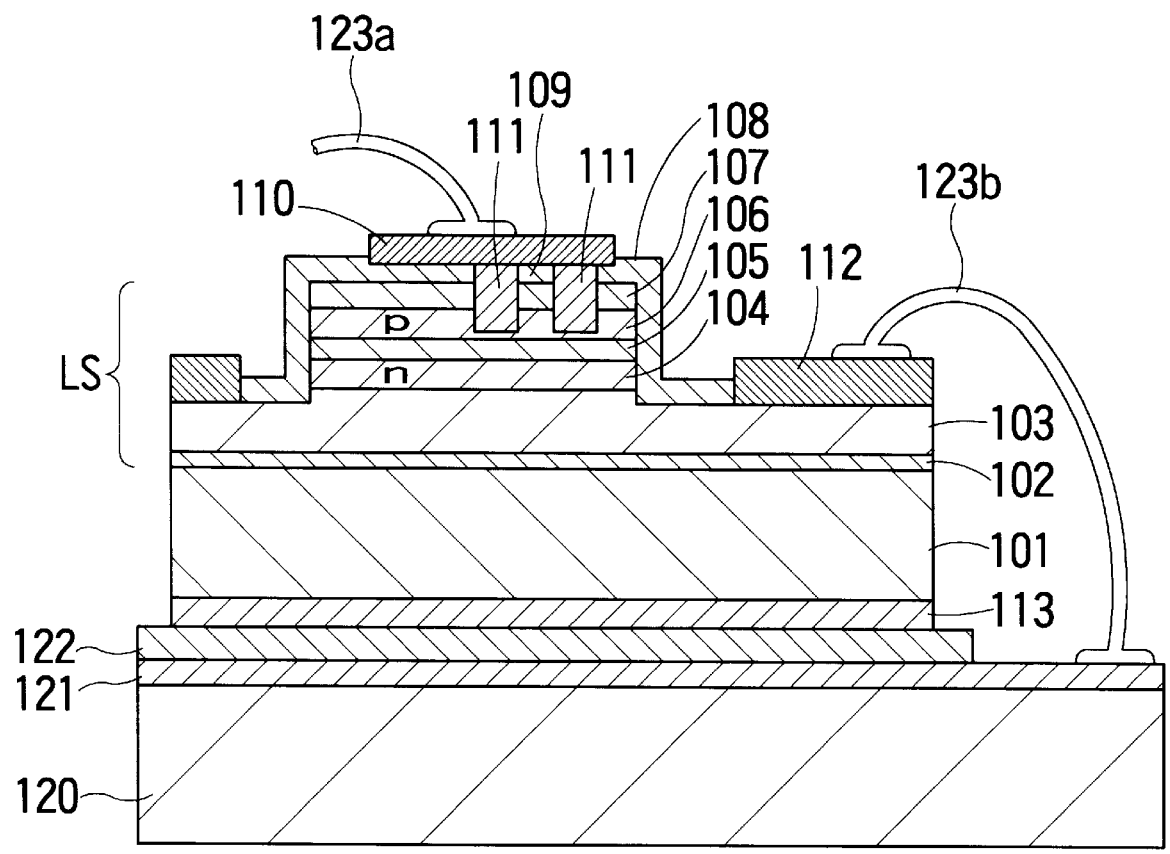
FIG. 1 is a schematic cross-sectional view of a device according to the first embodiment of the invention.

FIG. 1 is a cross-sectional view schematically showing a gallium nitride blue semiconductor laser device according to the first embodiment of the invention. Numeral 101 denotes a sapphire substrate, and LS denotes a multi-layered structure of gallium nitride compound semiconductors stacked on the substrate 101. More specifically, the multi-layered structure LS includes a GaN buffer layer 102, n-type GaN contact layer 103 (doped with Si by the concentration of $5 \times 10^{18} cm^{-3}$ and 4 μm thick), n-type $Al_{0.15}Ga_{0.85}N$ cladding layer 104 (doped with Si by the concentration of $1 \times 10^{18} cm^{-3}$ and 0.3 μm thick), active layer 105, p-type $Al_{0.15}Ga_{0.85}N$ cladding layer 106 (doped with Mg by $1 \times 10^{18} cm^{-3}$ and 0.3 μm thick) and p-type GaN contact layer (doped with Mg by $1 \times 10^{18} cm^{-3}$ and 1 μm thick). The active layer 105 has a SCH-MQW (Separate Confinement Heterostructure Multi-Quantum Well) structure made by stacking a GaN guiding layer (undoped and 0.1 μm thick), an active region with a quantum-well structure and a p-type GaN guiding layer (Mg-doped and 0.1 μm thick). The active region is made by stacking pairs of $In_{0.2}Ga_{0.8}N$ well layers (undoped and 2 nm thick) and $In_{0.05}Ga_{0.95}N$ barrier layers (undoped and 4 nm thick) up to ten cycles.

The device further includes a $SiO_2$ insolation film 108, Pt(10 nm)Ti(50 nm)/Pt(30 nm)/Au(100 nm) multi-layered p-side electrode 109, Cr/Au p-electrode pad 110, Ti/Au n-side electrode 112, and Cr/Au mounting film 113. On the laser light emitting facet, a $TiO_2/SiO_2$ multi-layered high-reflective coat (not shown) is applied Substantially parallel two grooves are formed on the surface of the multi-layered structure LS, and an insulator or a semiconductor is applied in the grooves to form a current blocking layers 111. Polyimide, for example, is an appropriate insulator for making the current blocking layers 111. An exemplary semiconductor for making the current blocking layers 111 is, for example, n-type $Ga_xIn_yAl_zN$ (x+y+z=1, $0 \leq x \leq 1$, $0 \leq y \leq 1$, and $0 \leq z \leq 1$). That it, by using an n-type semiconductor, a p-n junction can be made to effectively constrict the current.

When the current blocking layers 111 are made of polyimide, the structure operates as both a current confining structure and a light confinement region. Since polyimide exhibits a light absorption ratio as high as 90 to 60% in wavelength bands from 400 nm through 450 nm, the current blocking layers 111 made of polyimide are preferable as the light confinement region for suppressing higher-order modes.

When using an n-type $Ga_xIn_yAl_zN$ layer having a energy gap smaller than the one corresponding to the oscillating wavelength, for example, as the material of the current blocking layers, since this material is not transparent to emission wavelengths, the layers 111 can effectively absorb light of higher-order transverse modes and ensure emission of the fundamental transverse mode.

As shown in FIG. 1, the current blocking layers 111 are preferably deep enough to extend down into the p-type cladding layer 106 close to the active layer 105 because the current blocking layers 111 deep into the p-type cladding layer 106 are more effective for constraining transverse diffusion of the injected current and for absorbing light of higher-order modes.

That is, by extending the current blocking layers 111 into the p-type cladding layer 106 close to the active layer 105, they shut transverse current paths to effectively confine the current, and thereby promote emission in the fundamental transverse mode.

Next explained is a method for manufacturing the nitride compound semiconductor laser with reference to FIGS. 2A through 2F showing the laser under different steps of the manufacturing process. In the example shown here, polyimide is exemplarily used as the material of the current blocking layers 111.

Figure 2A:
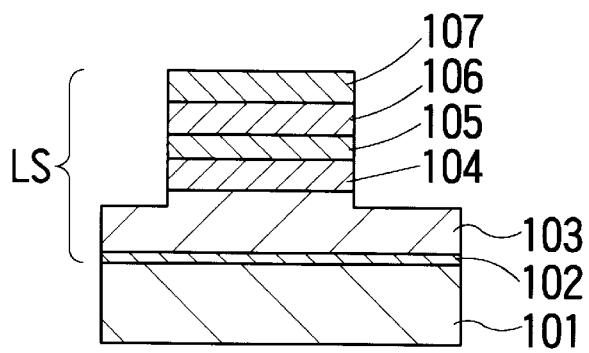
FIGS. 2A through 2E are schematic cross-sectional views of the device of FIG. 1 under different steps of a manufacturing process.

As shown in FIG. 2A, layers from the GaN buffer layer 102 to the p-type GaN contact layer 107 are grown on a sapphire substrate by metal-organic chemical vapor deposition (MOCVD). Then the grown semiconductor layers are selectively etched to expose the n-type GaN contact layer 103 to form a mesa configuration in order to make the n-electrode. A nitride compound semiconductor layers with a flat surface and less crytalline defects can be made on the two-layered GaN buffer layer 102 which is formed by first stacking it up to 30 nm at 550° C. and then growing another 1 $\mu$m thick layer at 1100° C.

Figure 2D:
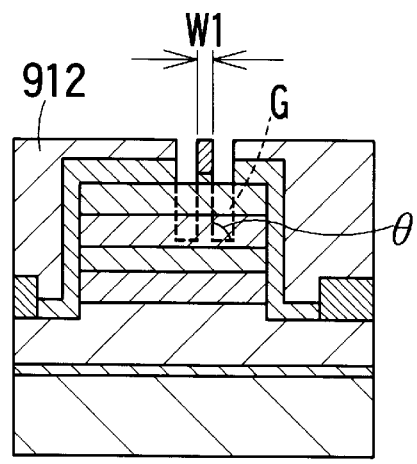
Figure 2B:
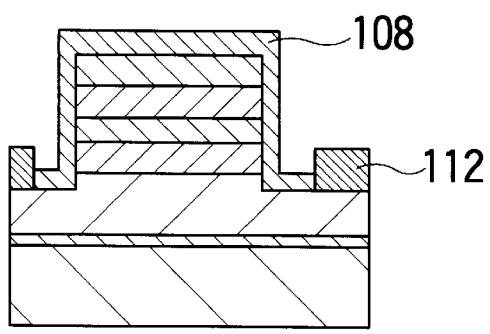

Next, as shown in FIG. 2B, the $SiO_2$ insulation film 108 is stacked on the entire surface of the wafer up to 900 nm, and the Ti/Au multi-layered n-side electrode 112 is formed in selective portions of the n-type GaN contact layer 103. The n-side electrode 112 is preferably parallel with and distant within 10 $\mu$m from the stripe-shaped current blocking structure to be made later. If the n-type GaN contact layer has a thickness not less than 2 $\mu$m and a carrier concentration not less than $2 \times 10^{18} cm^{-3}$, then the sum of the device resistance component between the light emitting region and the n-side electrode and the contact resistance component of the n-electrode can be reduced to 1 $\Omega$ or less, and the semiconductor laser can be driven with a even lower voltage.

Figure 2E:
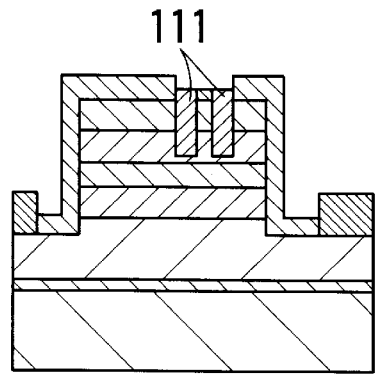
Figure 2C:
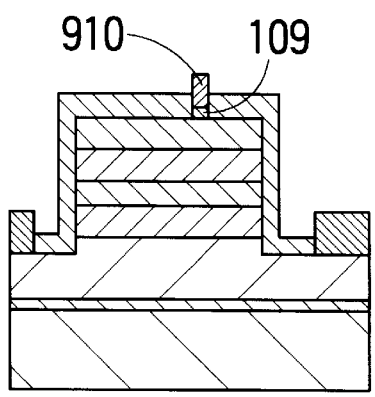

Next, as shown in FIG. 2C, the Pt(10 nm)/Ti(50 nm)/Pt (30 nm)/Au(100 nm) multi-layered p-side electrode 109 and a Ni dry etching mask 910 made of 1 $\mu$m-thick nickel (Ni) in form of a 3 $\mu$m-wide stripe are formed on the mesa structure. The width of the stripe-shaped p-side electrode 109 and the Ni dry etching mask 910 is preferably within the range from 2 $\mu$m to 8 $\mu$m.

Next, as shown in FIG. 2D, 10 $\mu$m-wide openings are formed at opposite sides of the p-side electrode 109 and the Ni dry etching mask 910 by using a photo resist 912. Then, grooves G for the current confining structure are made to extend into the p-type $Al_{0.15}Ga_{0.85}N$ cladding layer 106 by dry etching using chlorine gas, and the photo resist 912 and the dry etching mask 910 are removed thereafter. The angle $\theta$ of side surfaces of the grooves made by dry etching is preferably 90°. However, any value of $\theta$ within the range from 90° to 135° is acceptable because the error in width of injection of a current into the active layer 105 relative to the width W1 of the p-electrode 109 is held within the range from 0 $\mu$m to +2.6 $\mu$m, and the maximum increase of the threshold current can be limited to a double approximately.

As a result of investigation on the relation between transverse modes with the distance between the current blocking layers, it was observed that the fundamental mode tends to be produced when the width W1 does not exceed 8 $\mu$m. Therefore, the distance between the grooves is preferably determined to limit W1 within 8 $\mu$m.

On the other hand, upon growing the gallium nitride crystal layer on the sapphire substrate 101, it was observed that a flat crystal layer tends to be obtained by alleviation of lattice distortion when the thickness is more than 2 $\mu$m.

From the viewpoint of electric resistance, n-type layers have sheet resistance values as lower as one tenth than those of p-type layers. It was found that the n-side device resistance does not substantially affect the characteristics, such as operation voltage, consumption power, etc., during laser emission provided that the condition is satisfied where the distance of the current blocking layers is within four times the thickness W2 of the n-type GaN contact layer 103. More specifically, as long as W1 is within four times of W2, the ratio of resistance component contributing to the operation voltage of the semiconductor laser becomes p-side:n-side= 10:1, approximately, the n-side resistance component of the device is negligibly small as compared with the p-side resistance component, and the device resistance is definitely determined by the resistance component of p-type layers.

From reviews made above, it has been found that, if the distance W1 of the current blocking layers and the thickness W2 of the n-type GaN contact layer have a relation satisfying $W1 \leq 4 \cdot W2$, the growth of a high-quality gallium nitride crystal layer on the sapphire substrate, suppression of the fundamental transverse mode as well, and sufficient reduction of the device resistance are promised.

Moreover, since the width of the current injection is determined by the width W1 of the p-electrode 109, the invention is suitable for making a narrow current confining structure. That is, even in a current confining structure whose current injection width is narrow, the contact area of the p-electrode 109 can be maximized, and this results in preventing an increase in resistance of any portion in contact with the electrode.

Next, as shown in FIG. 2E, the entire surface of the wafer except for the n-side electrode 112 is coated by polyimide, and then etched by oxygen ashing until exposing the p-side electrode 109. In this manner, by filling the grooves with polyimide, the current block layers 111 can be obtained. The use of photosensitive polyimide makes this process easy. Alternatively, after applying polyimide on the entire surface of the wafer, an ordinary lithography process may be executed to expose the n-side electrode 112 alone.

When using n-type $In_{0.1}Ga_{0.9}N$ as the material of the current block layers 111, after applying n-type $In_{0.1}Ga_{0.9}N$ on the entire surface of the wafer instead of polyimide, it may be selectively etched away to expose the p-side electrode 109. In this manner, the current blocking layer 111 made by filling the grooves G with n-type $In_{0.1}Ga_{0.9}N$ can be formed.

Even if polyimide or other material remains on side surfaces of the $SiO_2$ insulation film 108 or on a part of the n-side electrode 112, the device characteristics are not adversely affected as long as no problem occurs on wiring. The layers 111 for current blocking and light confinement may be made of any other appropriate insulator or n-type $Ga_xIn_yAl_zN$ ($x+y+z=1$, $0 \leq x \leq 1$, $0 \leq y \leq 1$, $0 \leq z \leq 1$) in lieu of polyimide or n-type $In_{0.1}Ga_{0.9}N$.

Figure 2F:
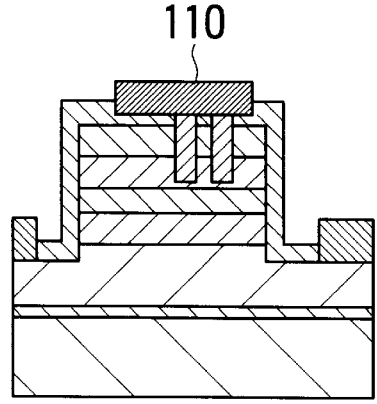

Next, as shown in FIG. 2F, the p-electrode pad 110 is made for wire bonding or flip chip mounting. Then, the bottom surface of the sapphire substrate 101 is polished controlling the thickness of the substrate 101 down to 50 $\mu$m. After that, the Cr/Au multi-layered mounting film 113 is made as shown in Fig.1, and the product is cleaved along planes normal to the substrate. Although not shown, a high-reflective coat made by alternately stacking $TiO_2$ and $TiO_2$ is applied on the cleaved facet. Then, as shown in FIG. 1, the device is mounted on a heat sink by using gold.tin (AuSu) eutectic solder 122. The heat sink is made of a high thermal conductivitive material, such as copper (Cu), cubic boron nitride or diamond, metallized with Ti/Pt/Au multi-layered coating, for example. The wiring 123a and 123b used for current injection are gold (Au) wires or aluminum (Al) wires.

When the cavity length is 0.5 mm, a semiconductor laser according to the embodiment was actually operative for continuous oscillation at the wavelength of 420 nm with the threshold current 60 mA and the operation voltage of 5.2 V. The device life was beyond 5000 hours when driven at 50° with 30 mW. The relative intensity noise under 20° C. through 70° C. was below −140 dB/Hz. By forming the current confining structure deep enough to reach the p-type $Al_{0.15}Ga_{0.85}N$ cladding layer 106 in self alignment with the p-side electrode 109, the laser according to the invention can suppress transverse dispersion of the current in the p-type layer, and thereby increases the carrier injection efficiency into the SCH-MQW active layer 105. At the same time, by making the current blocking layers 111 of polyimide, the laser has an excellent light confinement region and can suppress higher-order modes. Additionally, when the SCH-MQW active layer 105 is entirely covered by the $SiO_2$ insulation film 108 and the $TiO_2/SiO_2$ multi-layered high-reflective coat, the surface leak current can be suppressed. Therefore, continuous oscillation at a room temperature with a low injected current and low noise characteristics were realized.

Next explained is the second embodiment of the invention.

Figure 3A:
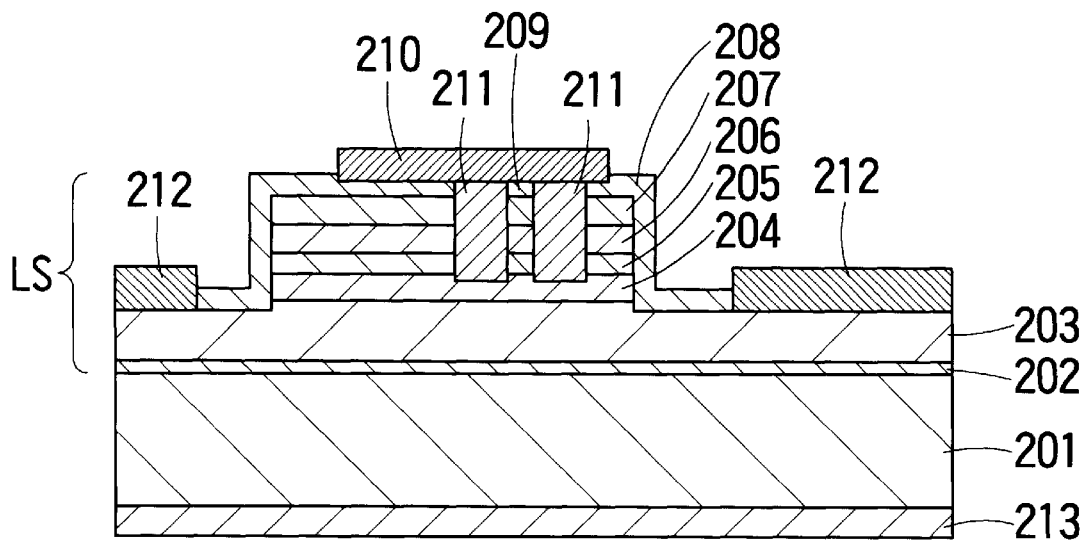
FIGS. 3A and 3B are schematic cross-sectional views of a device according to the second embodiment of the invention.
Figure 3B:
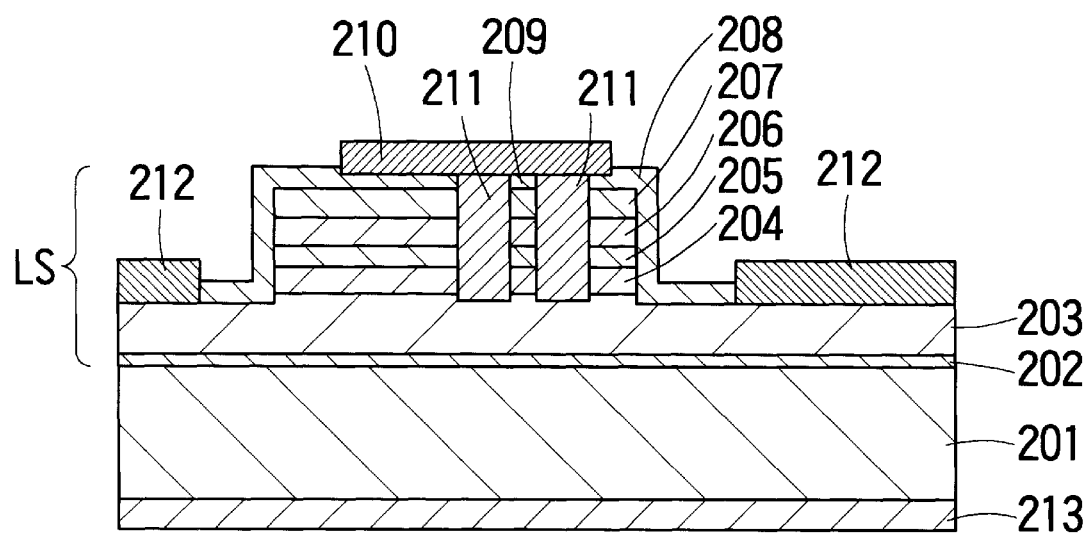

FIGS. 3A and 3B are cross-sectional views schematically showing a gallium nitride blue semiconductor laser device according to the second embodiment. Reference numeral 201 denotes a sapphire substrate, and LS denotes a multi-layered structure made of gallium nitride compound semiconductors stacked thereon. More specifically, the multi-layered structure LS includes a GaN buffer layer 202, n-type GaN contact layer 203 (doped with Si by the concentration of $5×10^{18} cm^{−3}$ and 4 μm thick), n-type $Al_{0.15}Ga_{0.85}N$ cladding layer 204 (doped with Si by the concentration of $1×10^{18} cm^{−3}$ and 0.3 μm thick), active layer 205, p-$Al_{0.15}Ga_{0.85}N$ cladding layer 206 (doped with Mg by $1×10^{18} cm^{−3}$ and 0.3 μm thick) and p-GaN contact layer 207 (doped with Mg by $1×10^{18} cm^{−3}$ and 1 μm thick). The active layer 205 has a SCH-MQW (Separate Confinement Heterostructure Multi-Quantum Well) structure made by stacking a GaN region (undoped and 0.1 μm thick), an active region with a quantum-well structure and a p-type GaN guide region (Mg-doped and 0.1 μm thick). The active region is made by stacking ten layers of $In_{0.2}Ga_{0.8}N$ well layers (undoped and 2 nm thick) and $In_{0.05}Ga_{0.95}N$ barrier layers (undoped and 4 nm thick) sandwiching the well layers.

The device further includes a $SiO_2$ insolation film 208, Pt(10 nm)Ti(50 nm)/Pt(30 nm)/Au(100 nm) p-side electrode 209, Cr/Au p-electrode pad 210, current blocking layers 211, Ti/Au n-side electrode 212, and Cr/Au mounting film 213. Although the drawings do not show, a $TiO_2/SiO_2$ multi-layered high-reflective coats are applied on the laser light emitting facets.

The second embodiment is different from the first embodiment in that the layers 211 for current blocking and light confinement extend to the n-type $Al_{0.15}Ga_{0.85}N$ cladding layer 204 in FIG. 3A and to the n-type GaN contact layer 203 in FIG. 3B. The depth of the layer 211 can be controlled by adjusting the dry etching time in the manufacturing process. The semiconductor laser shown here can be made by first growing the GaN buffer layer 202 through the p-type GaN contact layer 207 on a sapphire substrate by MOCVD, then forming grooves, and filling the grooves with polyimide or other insulator. For greater details of the manufacturing process, explanation made on the first embodiment is here again valid.

When the current blocking layers 211 are made to extend into the n-type $Al_{0.15}Ga_{0.85}N$ cladding layer 204 as shown in FIG. 3A, their current blocking function is more effective than the device shown in FIG. 1. Moreover, since the active layer 205 can be separated by the blocking layers 211, oscillation in the fundamental transverse mode occurs more easily. In this case, however, polyimide or other insulator is preferably used as the material of the blocking layers 211 because the blocking layers 211 contacts with the n-type layer 204.

When the current blocking layers 211 are made to extend into the n-type GaN contact layer 203 as shown in FIG. 3B, the current injected through the electrode is constrained more effectively. When conductive SiC, for example, is used as the substrate material, the n-side electrode may be formed on the bottom surface of the substrate 201 instead of the upper side as illustrated. Thus, in the structure based on FIG. 3B, more effective constraint of the injected current is expected.

The semiconductor laser having the structure shown in FIG. 3A and having the cavity length of 0.5 mm, showed a continuous oscillation at a room temperature under the threshold current of 55 mA, pulsation wavelength of 420 nm, and operation voltage of 5.1 V. The device life was beyond 5000 hours when driven at 50° C. with 30 mW, and the relative intensity noise at temperatures from 20° C. through 70° C. was under −145 dB/Hz. This laser structure can suppress transverse dispersion of the current and can thereby increase the carrier injection efficiency into the SCH-MQW active layer 205 by making the current blocking layers extending into the n-type $Al_{0.15}Ga_{0.85}N$ cladding layer, using the p-side electrode 209. Moreover, by using polyimide exhibiting a light absorption ratio as high as 90 to 60% in the band of wavelengths from 400 nm to 450 nm, the region effectively confining light can be made, and higher-order modes can be suppressed effectively. Additionally, the SCH-MQW active layer 205 can be entirely covered with the $SiO_2$ insulation film 208 and the $TiO_2/SiO_2$ multi-layered high-reflective coat, and can suppress a surface leak current. Therefore, continuous oscillation at a room temperature with a low injected current and low noise characteristics were recognized.

Further, even when the p-side electrode contacted with the n-type $In_{0.1}Ga_{0.9}N$ current blocking layers 211, the threshold current did not increase largely because an insulator, such as polyimide, was used.

Next explained is the third embodiment of the invention.

Figure 4:
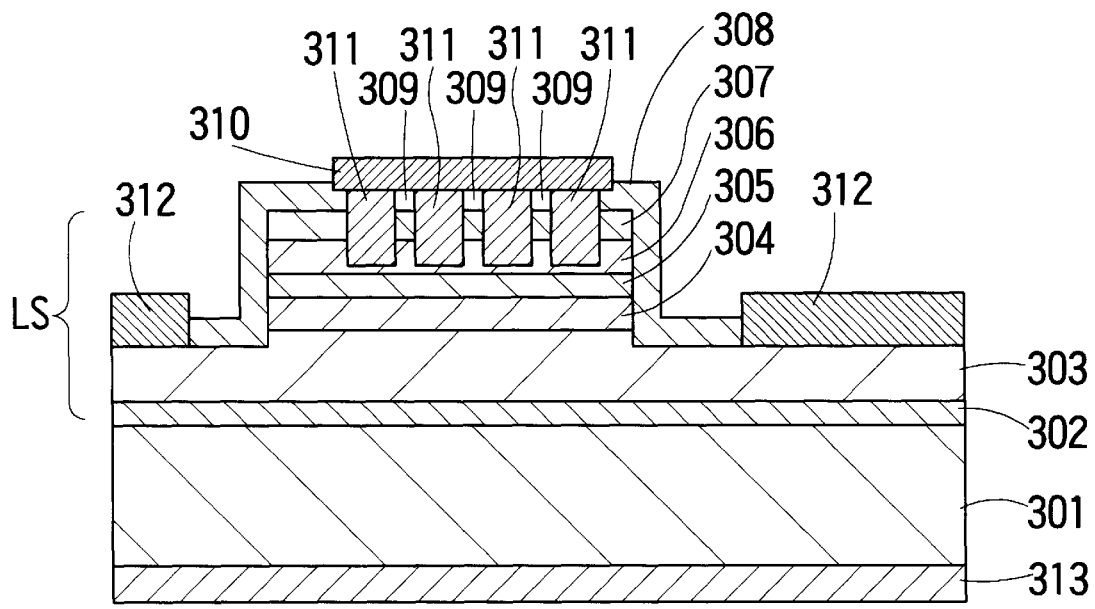
FIG. 4 is a schematic cross-sectional view of a device according to the third embodiment of the invention.

FIG. 4 is a cross-sectional view schematically showing a gallium nitride blue semiconductor laser according to the third embodiment. Reference numeral 301 denotes a sapphire substrate, and LS denotes a multi-layered structure made of gallium nitride compound semiconductors stacked thereon. The multi-layered structure LS includes a GaN buffer layer 302, n-type GaN contact layer 303 (doped with Si by the concentration of $5×10^{18} cm^{−3}$ and 4 μm thick), n-type $Al_{0.15}Ga_{0.85}N$ cladding layer 304 (doped with Si by the concentration of $1×10^{18} cm^{−3}$ and 0.3 μm thick), active layer 305, p-type $Al_{0.15}Ga_{0.85}N$ cladding layer 306 (doped with Mg by $1×10^{18} cm^{−3}$ and 0.3 μm thick) and p-type GaN contact layer 307 (doped with Mg by $1×10^{18} cm^{−3}$ and 1 pm thick). The active layer 305 has a SCH-MQW (Separate Confinement Hetero-structure Multi-Quantum Well) structure made by stacking a GaN region (undoped and 0.1 μm thick), an active region with a quantum-well structure and a p-type GaN guide region (Mg-doped and 0.1 μm thick). The active region is made by stacking ten layers of $In_{0.2}Ga_{0.8}N$ well layers (undoped and 2 nm thick) and $In_{0.05}Ga_{0.95}N$ barrier layers (undoped and 4 nm thick) sandwiching the well layers.

The device further includes a $SiO_2$ insolation film 308, Pt(10 nm)Ti(50 nm)/Pt(30 nm)/Au(100 nm) multi-layered p-side electrode 309, Cr/Au p-electrode pad 310, current blocking layers 311, Ti/Au n-side electrode 312, and Cr/Au mounting film 313. Although the drawing does not show, a $TiO_2/SiO_2$ multi-layered high-reflective coat is applied on the laser light emitting facet.

The third embodiment is different from the first embodiment in having four current blocking layers 311. As a result, there is formed a so-called multi-beam laser device having three current injection regions and three laser exits. Here again, the semiconductor laser can be fabricated in substantially the same process as the first embodiment. The layers 311 for current blocking and light confinement can be made of an insulator, such as polyimide, or a semiconductor material of any desired composition expressed by n-$Ga_xIn_yAl_zN$ ($x+y+z=1$, $0 \leq x \leq 1$, $0 \leq y \leq 1$, $0 \leq z \leq 1$) like those explained with the first embodiment.

According to the third embodiment, when the cavity length is 0.5 mm, continuous oscillation of the laser was confirmed at a room temperature under the threshold current of 180 mA, pulsation wavelength of 420 nm, and operation voltage of 5.6 V. The maximum optical output was 100 mW. This laser realizes higher optical output characteristics because a plurality of layers for current blocking and light confinement are formed to define a plurality of current injection regions and laser emission exits. According to the invention, the number of the blocking layers is not limited to the drawing. For example three blocking layers of more than four blocking layers can be employed as well.

This embodiment, promising higher optical output, is applicable to provide a laser pointer, for example, with a high output.

Next explained is the fourth embodiment of the invention.

Figure 5:
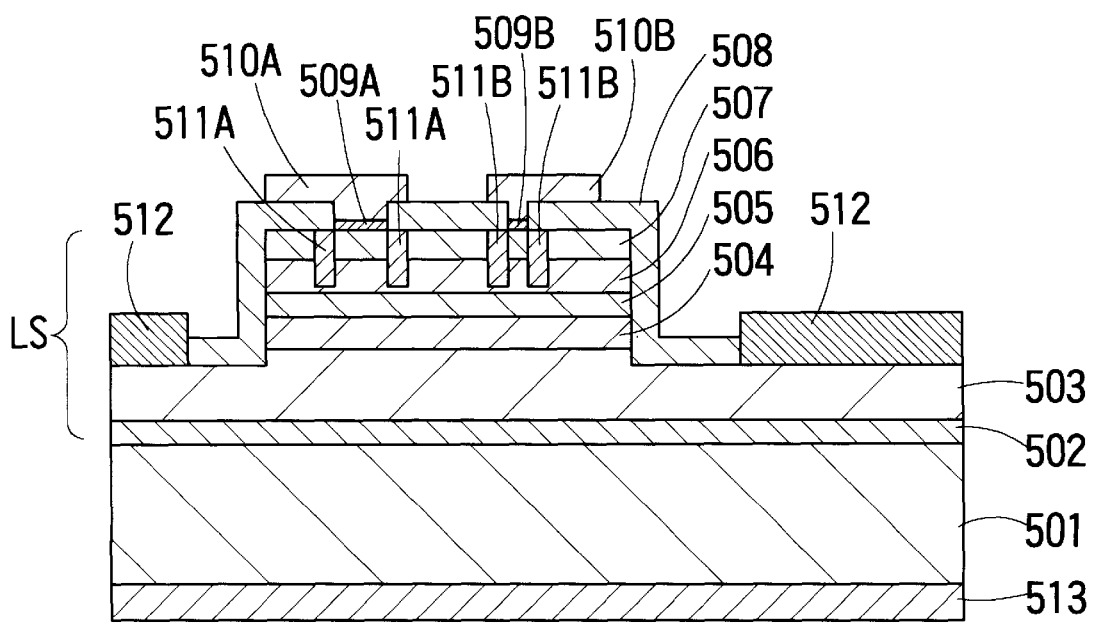
FIG. 5 is a schematic diagram of a device according to the fourth embodiment of the invention.

FIG. 5 is a cross-sectional view schematically showing a gallium nitride blue semiconductor laser device according to the fourth embodiment. Reference numeral 501 denotes a sapphire substrate, and LS denotes a multi-layered structure made of gallium nitride compound semiconductors stacked thereon. The multi-layered structure LS includes a GaN buffer layer 502, n-type GaN contact layer 503 (doped with Si by the concentration of $5 \times 10^{18} cm^{-3}$ and 4 $\mu$m thick), n-type $Al_{0.15}Ga_{0.85}N$ cladding layer 504 (doped with Si by the concentration of $1 \times 10^{18} cm^{-3}$ and 0.3 $\mu$m thick), active layer 505, p-type $Al_{0.15}Ga_{0.85}N$ cladding layer 506 (doped with Mg by $1 \times 10^{18} cm^{-3}$ and 0.3 $\mu$m thick) and p-type GaN contact layer 507 (doped with Mg by $1 \times 10^{18} cm^{-3}$ and 1 $\mu$m thick). The active layer 505 has a SCH-MQW (Separate Confinement Hetero-structure Multi-Quantum Well) structure made by stacking a GaN region (undoped and 0.1 $\mu$pm thick), an active region with a quantum-well structure and a p-type GaN guide region (Mg-doped and 0.1 $\mu$m thick). The active region is made by stacking ten layers of $In_{0.2}Ga_{0.8}N$ well layers (undoped and 2 nm thick) and $In_{0.05}Ga_{0.95}N$ barrier layers (undoped and 4 nm thick) sandwiching the well layers.

The device further includes a $SiO_2$ insolation film 508, Pt(10 nm)Ti(50 nm)/Pt(30 nm)/Au(100 nm) multi-layered p-side electrodes 509A and 509B, Cr/Au p-electrode pads 510A and 510B, current blocking layers 511A and 511B, Ti/Au n-side electrode 512, and Cr/Au mounting film 513. Although the drawing does not show, a $TiO_2/SiO_2$ multi-layered high-reflective coat is applied on the laser light emitting facet.

Here again, the device has more than two current blocking layers 511A, 511A, 511B like the third embodiment shown in FIG. 4. The fourth embodiment, however, is different from the third embodiment in that the distance between the current blocking layers 511A, 511A is different from the distance between the current blocking layers 511B, 511B. That is, in this embodiment, the distance between the current blocking layers 511A, 511A at opposite sides of the p-side electrode 509A is wider than the distance between the current blocking layers 511B, 511B at opposite sides of the p-side electrode 509B. Moreover, these p-side electrodes 509A, 509B are separate, and connected to different electrode pads 510A, 510B.

The multi-beam laser having current blocking layers 511A, 511A, 511B, 511B to define current confining structures with different distances makes it possible to use its individual laser portions for different purposes.

For example, when the distance between the current blocking layers 511A, 511A at opposite sides of the p-side electrode 509A is approximately 8 $\mu$m, optical output of approximately 20 to 30 mW can be obtained, and this portion can be used as a data writing light source in an optical disc system. If the distance between the current blocking layers 511B, 511B at opposite sides of the p-side electrode 509B is approximately 2 $\mu$m, low-power laser light of the fundamental transverse mode suitable for reading data in an optical disc system can be obtained with a low driving current.

That is, a single integrated semiconductor laser chip can be used for both reading and writing of optical discs. This contributes to minimize the size of optical systems in any devices. If the thickness of the active layer in a laser portion with a larger distance between the current blocking layers is larger than the thickness of the active layer in a laser portion with a smaller distance between the current blocking layers, optical output of the former laser portion can be increased further.

According to the embodiment, a plurality of laser portions can be made in an array in a single semiconductor laser device, and a high-power laser pointer and a display apparatus using a laser can be realized. In this case, by changing the composition of the active layer for respective laser portions, integration of lasers of three RGB colors is possible, and this makes it easy to realize a raster scan image display using a single set of optical lenses and a large-scale outdoor display with a low power consumption.

Here again, the current blocking layers 511A, 511B can be made of an insulator, such as polyimide, or a semiconductor material, such as n-type $Ga_xIn_yAl_zN$ ($x+y+z=1$, $0 \leq x \leq 1$, $0 \leq y \leq 1$, $0 \leq z \leq 1$) like those explained with other embodiments.

According to the invention, the number of the blocking layers is not limited to the drawing. For example three pairs (total six blocking layers) or more pairs of the blocking layers can be employed as well.

Next explained is the fifth embodiment of the invention.

Figure 6:
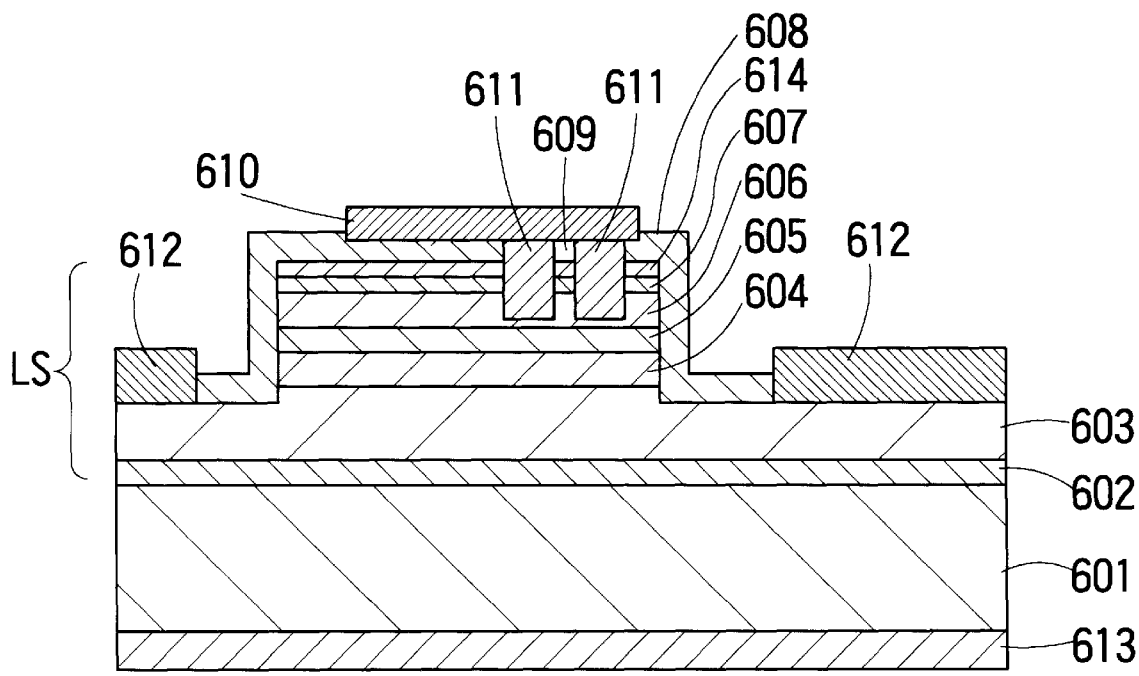
FIG. 6 is a chematic cross-sectional view of a device according to the fifth embodiment of the invention.

FIG. 6 is a cross-sectional view schematically showing a gallium nitride blue semiconductor laser device according to the fifth embodiment. Reference numeral 601 denotes a sapphire substrate, and LS denotes a multi-layered structure made of gallium nitride compound semiconductors. The multi-layered structure LS includes a GaN buffer layer 602, n-type GaN contact layer 603 (doped with Si by the concentration of $5 \times 10^{18} cm^{-3}$ and 4 $\mu$m thick), n-type $Al_{0.15}Ga_{0.85}N$ cladding layer 604 (doped with Si by the concentration of $1 \times 10^{18} cm^{-3}$ and 0.3 $\mu$m thick), active layer 605, p-type $Al_{0.15}Ga_{0.85}N$ cladding layer 606 (doped with Mg by $1 \times 10^{18} cm^{-3}$, 0.3 $\mu$m thick) and p-type GaN contact layer 607 (doped with Mg by $2 \times 10^{17} cm^{-3}$ and 1 µm thick), and p$^+$-type GaN contact layer (doped with Mg by $2 \times 10^{18} cm^{-3}$ and 1 µm thick). The active layer 605 has a SCH-MQW (Separate Confinement Hetero-structure Multi-Quantum Well) structure made by stacking a GaN region (undoped and 0.1 µm thick), an active region with a quantum-well structure and a p-type GaN guide region (Mg-doped and 0.1 µm thick). The active region is made by stacking ten layers of $In_{0.2}Ga_{0.8}N$ well layers (undoped and 2 nm thick) and $In_{0.05}Ga_{0.95}N$ barrier layers (undoped and 4 nm thick) sandwiching the well layers.

The device further includes a $SiO_2$ insolation film 608, Pt(10 nm)Ti(50 nm)/Pt(30 nm)/Au(100 nm) p-side electrode 609, Cr/Au p-electrode pad 610, current blocking layers 611, Ti/Au n-side electrode 612, and Cr/Au mounting film 613. Although the drawing does not show, a $TiO_2/SiO_2$ multi-layered high-reflective coat is applied on the laser light emitting facet.

The fifth embodiment is different from the first embodiment in the use of a two-step structure in which the carrier concentration of the p$^+$-type GaN contact layer 614 is higher than the carrir concentration of the p-type GaN contact layer 607. This can be realized by appropriately adjusting the impurity concentration in the process for making the contact layers 607, 614. In the other respect, the process of manufacturing the device is the same as those of the other embodiments. Like the first embodiment, an insulator, such as polyimide, or n-type $Ga_xIn_yAl_zN$ (x+y+z=1, $0 \leq x \leq 1$, $0 \leq y \leq 1$, $0 \leq z \leq 1$) with any composition ratio is acceptable for forming the layer for current blocking and light confinement.

According to the fifth embodiment, when the cavity length is 0.5 mm, continuous oscillation of the laser was confirmed at a room temperature under the threshold current of 180 mA, oscillation wavelength of 420 nm, and operation voltage of 5.3 V. The maximum optical output was 100 mW, and the life was at least 7000 hours when operated for optical output of 5 mW. The life was improved because the contact resistance with the p-side electrode was reduced, and resulted in decreasing the operation voltage and hence suppressing heat as compared with the first embodiment. Additionally, also when p-type $Ga_xIn_yAl_zN$ layer (x+y+z=1, $0 \leq x \leq 1$, $0 \leq y \leq 1$, $0 \leq z \leq 1$) including In and having a smaller energy gap than p-type GaN was used as the p$^+$-type GaN contact layer 614, the operation voltage was even decreased.

Next explained is the sixth embodiment of the invention.

Figure 7:
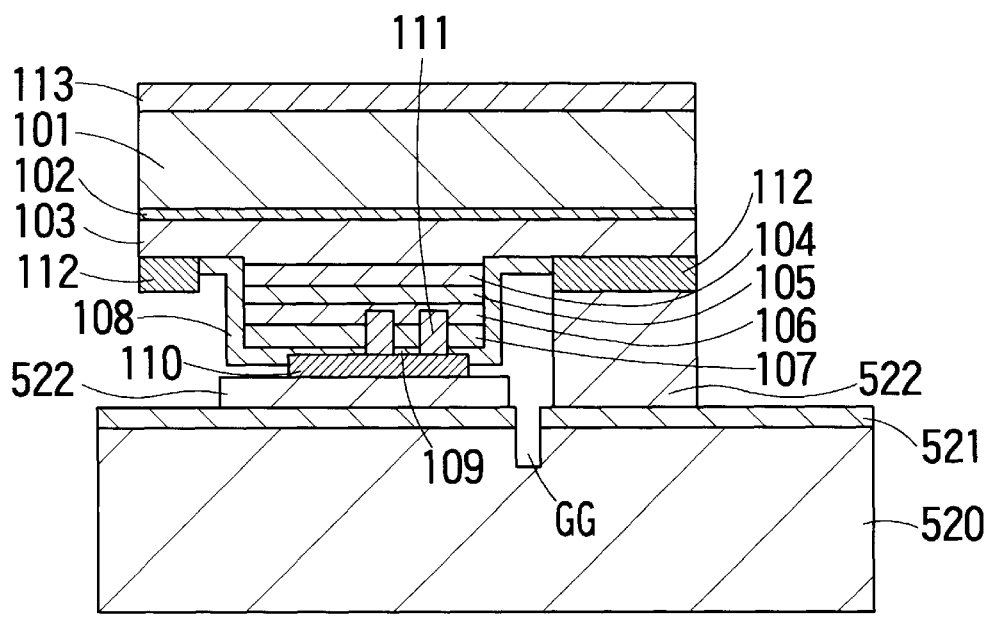
FIG. 7 is a schematic cross-sectional view of the device according to the first embodiment, which is mounted on a heat sink.

FIG. 7 is a cross-sectional view schematically showing a semiconductor laser mounted on a patterned heat sink by flip-chip mounting. The semiconductor laser shown here is the gallium nitride blue semiconductor laser according to the first embodiment.

To fabricate the semiconductor laser device showing in FIG. 7, the bottom surface of the sapphire substrate 101 is polished controlling the thickness of the thickness of the substrate 101 down to 50 µm. After that, the Cr/Au multi-layered mounting film 113 is made by vapor deposition, and the product is cleaved along planes normal to the substrate. A high-reflective coat made by alternately stacking $TiO_2$ and $SiO_2$ is applied on the cleaved facets. The heat sink 520 is made of a material having a high thermal conductivity, such as Cu, cubic-system boron nitride or diamond. Its surface has formed grooves GG for isolating electrodes, and is selectively metallized with a electrode pattern of Ti/Pt/Au, for example. The semiconductor laser device is mounted on the heat sink 520 by using a soldering material 522, such as AuSu eutectic solder, AuGe eutectic solder, AuSi solder, or the like.

When the cavity length is 0.5 mm, a semiconductor laser according to the embodiment was actually operative for continuous oscillation of the wavelength of 420 nm under the threshold current 60 mA and the operation voltage of 5.2 V. The device life was beyond 10000 hours when driven at 50° with 30 mW. The relative intensity noise under 20° C. through 70° C. was below −140 dB/Hz. The laser according to the invention is good in heat dissipation because heat generated in the active layer 105 is discharged through the underlying heat sink 520. The device life was therefore improved. A semiconductor laser according to any other embodiment described above may be used similarly, and ensures the same effects.

Although the invention has been explained by way of preferred embodiments, the invention is not limited to these examples.

For example, although the embodiments have been explained as filling the grooves G with polyimide or n-type $Ga_xIn_yAl_zN$ (x+y+z=1, $0 \leq x \leq 1$, $0 \leq y \leq 1$, $0 \leq z \leq 1$) after etching to form the current block layers 111, 311, 411, 511, 611, the invention is not limited to this mode. Any other insulator or semiconductor material may be used to obtain the same or equivalent effects.

Also for making p-side and n-side electrodes, various other materials are usable, such as Au—Be/Au, Au—Zn/Au, Pt/Ni/Au and Au—Zn/Ti/Au, for example, as the p-side electrode, and Al/Ti/Au, Al/Ni/Au, Al/Au, Ni/Al/Ti/Au, Au—Sn/Au and Au—Ge/Ni/Au, for example, as the n-side electrode. Additionally, for the purpose of improving ohmic properties of these electrodes, impurity concentration may be increased along surfaces of the p-GaN contact layer and n-GaN contact layer by using ion implantation, for example.

Moreover, semiconductor layers forming the semiconductor laser may be adjusted in composition and/or thickness, or may be inverted in conduction type. The invention is applicable also to photo diodes or other optics, and optical modulators or other optical devices, in addition to semiconductor lasers, light emitting diodes and other light emitting devices.

What is claimed is:

1. A nitride compound semiconductor laser comprising:
    a multi-layered structure made of gallium nitride compound semiconductors $Ga_xIn_yAl_zN$ where x+y+z=1, $0 \leq x \leq 1$, $0 \leq y \leq 1$ and $0 \leq z \leq 1$, including, at least, a first cladding layer of a first conduction type, an active layer overlying said first cladding layer and a second cladding layer of a second conduction type overlying said active layer; and
    current blocking layers made by forming at least two grooves extending on the major surface of said multi-layered structure closer to said second cladding layer and by filling said grooves with an insulator,
    said current blocking layers extending in a direction perpendicular to a light emitting facet and said current blocking layers being not exposed to side surfaces of said multi-layered structure perpendicular to said light emitting facet, wherein said multi-layered structure further comprises a contact layer of a first conduction type and an electrode in contact with said contact layer, the relation of $W1 \leq 4 \cdot W2$ being established where W1 is the distance between every adjacent two current blocking layers and W2 is the thickness of said contact layer.

2. The nitride compound semiconductor laser according to claim 1 wherein said current blocking layers are deep enough to reach said second cladding layer.

3. The nitride compound semiconductor laser according to claim 1 wherein said current blocking layers are deep enough to reach said first cladding layer.

4. The nitride compound semiconductor laser according to claim 1 wherein said multi-layered structure further includes a contact layer of said first conduction type underlying said first cladding layer, said current blocking layers being deep enough to reach said first contact layer.

5. The nitride compound semiconductor laser according to claim 1 wherein said insulator forming said current blocking layers is polyimide.

6. The nitride compound semiconductor laser according to claim 1 wherein said active layer has a multi-quantum well structure.

7. A nitride compound semiconductor laser comprising:
a multi-layered structure made of gallium nitride compound semiconductors $Ga_xIn_yAl_zN$ where $x+y+z=1$, $0 \leq x \leq 1$, $0 \leq y \leq 1$ and $0 \leq z \leq 1$, including, at least, a first cladding layer of a first conduction type, an active layer overlying said first cladding layer, and a second cladding layer of a second conduction type overlying said active layer; and
current blocking layers made by forming at least two grooves extending on the major surface of said multi-layered structure closer to said second cladding layer and by filling said grooves with an insulator;
wherein said multi-layered structure further comprises a contact layer of a first conduction type and an electrode in contact with said contact layer, the relation of $W1 \leq 4 \cdot W2$ being established where W1 is the distance between every adjacent two current blocking layers and W2 is the thickness of said contact layer.

8. The nitride compound semiconductor laser according to claim 1 including at least three said current blocking layers.

9. A nitride compound semiconductor laser comprising:
a multi-layered structure made of gallium nitride compound semiconductors $Ga_xIn_yAl_zN$ where $x+y+z=1$, $0 \leq x \leq 1$, $0 \leq y \leq 1$ and $0 \leq z \leq 1$, including, at least, a first cladding layer of a first conduction type, an active layer overlying said first cladding layer, and a second cladding layer of a second conduction type overlying said active layer; and
at least three current blocking layers made by forming at least two grooves extending on the major surface of said multi-layered structure closer to said second cladding layer and by filling said grooves with an insulator,
wherein said at least three current blocking layers are unequally distant.

10. The nitride compound semiconductor laser according to claim 1, wherein said electrode provided on said major surface of said multi-layered structure, said electrode overlying at least one of said current blocking layers.

11. The nitride compound semi-conductor laser according to claim 10, further comprising an insulating layer provided between said electrode and said multi-layered structure except for a part between said current blocking layers.

12. A nitride compound semiconductor laser comprising:
a multi-layered structure made of gallium nitride compound semiconductors $Ga_xIn_yAl_zN$ where $x+y+z=1$, $0 \leq x \leq 1$, $0 \leq y \leq 1$ and $0 \leq z \leq 1$, including, at least, a first cladding layer of a first conduction type, an active layer overlying said first cladding layer, and a second cladding layer of a second conduction type overlying said active layer; and
current blocking layers made by forming at least two grooves extending on the major surface of said multi-layered structure closer to said second cladding layer and by filling said grooves with a gallium nitride compound semiconductor of said first conduction type and having a composition different from the compositions of said active layer and said second cladding layer.
said current blocking layers extending in a direction perpendicular to a light emitting facet and said current blocking layers being not exposed to side surfaces of said multi-layered structure perpendicular to said light emitting facet, wherein said multi-layered structure further comprises a contact layer of a first conduction type and an electrode in contact with said contact layer, the relation of $W1 \leq 4 \cdot W2$ being established where W1 is the distance between every adjacent two current blocking layers and W2 is the thickness of said contact layer.

13. The nitride compound semiconductor laser according to claim 12 wherein said current blocking layers are deep enough to reach said second cladding layer.

14. The nitride compound semiconductor laser according to claim 12 wherein said current blocking layers are deep enough to reach said first cladding layer.

15. The nitride compound semiconductor laser according to claim 12 wherein said multi-layered structure further includes a contact layer of said first conduction type underlying said first cladding layer, said current blocking layers being deep enough to reach said first contact layer.

16. The nitride compound semiconductor laser according to claim 12 wherein said active layer has a multi-quantum well structure.

17. A nitride compound semiconductor laser comprising:
a multi-layered structure made of gallium nitride compound semiconductors $Ga_xIn_yAl_zN$ where $x+y+z=1$, $0 \leq x \leq 1$, $0 \leq y \leq 1$ and $0 \leq z \leq 1$, including, at least, a first cladding layer of a first conduction type, an active layer overlying said first cladding layer, and a second cladding layer of a second conduction type overlying said active layer; and
current blocking layers made by forming at least two grooves extending on the major surface of said multi-layered structure closer to said second cladding layer and by filling said grooves with a gallium nitride compound semiconductor of said first conduction type,
wherein said multi-layered structure further comprises a contact layer of a first conduction type and an electrode in contact with said contact layer, the relation of $W1 \leq 4 \cdot W2$ being established where W1 is the distance between every adjacent two current blocking layers and W2 is the thickness of said contact layer.

18. The nitride compound semiconductor laser according to claim 12 including at least three said current blocking layers.

19. A nitride compound semiconductor laser comprising:
a multi-layered structure made of gallium nitride compound semiconductors $Ga_xIn_yAl_zN$ where $x+y+z=1$, $0 \leq x \leq 1$, $0 \leq y \leq 1$ and $0 \leq z \leq 1$, including, at least, a first cladding layer of a first conduction type, an active layer overlying said first cladding layer, and a second cladding layer of a second conduction type overlying said active layer; and
at least three current blocking layers made by forming at least two grooves extending on the major surface of said multi-layered structure closer to said second cladding layer and by filling said grooves with a gallium nitride compound semiconductor of said first conduction type, wherein said at least three current blocking layers are unequally distant.

20. The nitride compound semiconductor laser according to claim 12, wherein said electrode provided on said major surface of said multi-layered structure, said electrode overlying at least one of said current blocking layers.

21. The nitride compound semiconductor laser according to claim 20, further comprising an insulating layer provided between said electrode and said multi-layered structure except for a part between said current blocking layers.

22. The nitride compound semiconductor laser according to claim 12, wherein said current blocking layers have an energy gap smaller than an energy gap corresponding to an oscillating wavelength and so as to provide light confinement regions.

23. The nitride compound semiconductor laser according to claim 12, wherein said current blocking layers have a light refractivity lower than that of said active layer.

* * * * *